(12) United States Patent
Weidner et al.

(45) Date of Patent: Sep. 1, 2020
(10) Patent No.: US 10,763,244 B2

(54) POWER MODULE HAVING POWER DEVICE CONNECTED BETWEEN HEAT SINK AND DRIVE UNIT

(71) Applicant: Siemens Aktiengesellschaft, Munich (DE)

(72) Inventors: Karl Weidner, Munich (DE); Kai Kriegel, Munich (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 165 days.

(21) Appl. No.: 15/571,829

(22) PCT Filed: Apr. 7, 2016

(86) PCT No.: PCT/EP2016/057567
§ 371 (c)(1),
(2) Date: Nov. 4, 2017

(87) PCT Pub. No.: WO2016/177528
PCT Pub. Date: Nov. 10, 2016

(65) Prior Publication Data
US 2018/0122782 A1    May 3, 2018

(30) Foreign Application Priority Data
May 6, 2015    (DE) .......... 10 2015 208 348

(51) Int. Cl.
*H01L 25/07*    (2006.01)
*H01L 25/18*    (2006.01)
(Continued)

(52) U.S. Cl.
CPC ............ *H01L 25/072* (2013.01); *H01L 21/56* (2013.01); *H01L 23/3121* (2013.01);
(Continued)

(58) Field of Classification Search
None
See application file for complete search history.

(56) References Cited

U.S. PATENT DOCUMENTS 6,756,667 B2    6/2004    Hiyoshi .............. 257/703
6,815,810 B2    11/2004    Takehara et al. ........ 257/687
(Continued)

FOREIGN PATENT DOCUMENTS

| CN | 102569286 A | 7/2012 | ............ H01L 23/31 |
| DE | 19633542 A1 | 3/1997 | ............ G01R 15/14 |

(Continued)

OTHER PUBLICATIONS

International Search Report and Written Opinion, Application No. PCT/EP2016/057567, 11 pages, dated Sep. 8, 2016.
(Continued)

*Primary Examiner* — Matthew E. Gordon
(74) *Attorney, Agent, or Firm* — Slayden Grubert Beard PLLC (57) ABSTRACT

The present disclosure relates to power modules. The teachings thereof may be embodied in a power unit and/or a drive unit for driving the power unit, along with methods for producing a power module. For example, a power module may include: a power unit including a heat sink; a power device disposed on the heat sink; an insulating layer covering the heat sink and the power device; and a drive unit for driving the power unit, the drive unit comprising a contact element corresponding to the contact area of the power unit. An underside of the power unit is defined by an underside of the heat sink. A top side of the power unit is defined by a contact area thermally and/or electrically coupled to the power device and a surface of the insulating layer surrounding the contact area. The contact element may be disposed
(Continued)

abutting the contact area of the power unit for making electrical and/or thermal contact with the power device.

8 Claims, 3 Drawing Sheets

(51) Int. Cl.

| | | |
|---|---|---|
| *H01L 23/373* | (2006.01) | |
| *H01L 23/538* | (2006.01) | |
| *H01L 23/498* | (2006.01) | |
| *H01L 23/31* | (2006.01) | |
| *H01L 23/34* | (2006.01) | |
| *H01L 23/367* | (2006.01) | |
| *H01L 23/40* | (2006.01) | |
| *H01L 23/482* | (2006.01) | |
| *H01L 25/00* | (2006.01) | |
| *H01L 23/00* | (2006.01) | |
| *H01L 21/56* | (2006.01) | |
| *H01L 25/16* | (2006.01) | |

(52) U.S. Cl.
CPC .......... *H01L 23/34* (2013.01); *H01L 23/3675* (2013.01); *H01L 23/3735* (2013.01); *H01L 23/4012* (2013.01); *H01L 23/482* (2013.01); *H01L 23/49811* (2013.01); *H01L 23/5386* (2013.01); *H01L 23/5389* (2013.01); *H01L 24/32* (2013.01); *H01L 24/40* (2013.01); *H01L 24/72* (2013.01); *H01L 24/73* (2013.01); *H01L 24/83* (2013.01); *H01L 25/162* (2013.01); *H01L 25/165* (2013.01); *H01L 25/18* (2013.01); *H01L 25/50* (2013.01); *H01L 24/29* (2013.01); *H01L 2023/405* (2013.01); *H01L 2023/4031* (2013.01); *H01L 2023/4087* (2013.01); *H01L 2224/293* (2013.01); *H01L 2224/29294* (2013.01); *H01L 2224/32227* (2013.01); *H01L 2224/40227* (2013.01); *H01L 2224/73251* (2013.01); *H01L 2224/73263* (2013.01); *H01L 2224/8384* (2013.01); *H01L 2224/83192* (2013.01); *H01L 2924/13055* (2013.01); *H01L 2924/13091* (2013.01); *H01L 2924/146* (2013.01); *H01L 2924/1426* (2013.01); *H01L 2924/14252* (2013.01)

(56) References Cited

U.S. PATENT DOCUMENTS

| | | | |
|---|---|---|---|
| 8,692,349 B2 | 4/2014 | Kim et al. | 257/467 |
| 2002/0179289 A1 | 12/2002 | Yamas et al. | 165/104.33 |
| 2005/0087849 A1 | 4/2005 | Morita et al. | 257/678 |
| 2009/0129432 A1* | 5/2009 | Luniewski | H01L 23/34 |
| | | | 374/100 |
| 2012/0001316 A1* | 1/2012 | Hauenstein | H01L 23/13 |
| | | | 257/690 |
| 2012/0162931 A1 | 6/2012 | Kim et al. | 361/729 |
| 2014/0055973 A1 | 2/2014 | Hirai et al. | 361/803 |
| 2014/0111944 A1 | 4/2014 | Hara et al. | 361/720 |
| 2015/0292099 A1* | 10/2015 | Ru | C25D 7/00 |
| | | | 174/251 |
| 2016/0126192 A1* | 5/2016 | Hohlfeld | H01L 23/5389 |
| | | | 257/668 |

FOREIGN PATENT DOCUMENTS

| | | | | |
|---|---|---|---|---|
| DE | 102012201890 A1 | 6/2013 | ............ | H01L 23/34 |
| GB | 230502 A | 3/1997 | ............ | H02M 7/00 |
| JP | 2003051573 A | 2/2003 | ............ | H01L 23/373 |
| JP | 2003124435 A | 4/2003 | ............ | H01L 23/39 |
| JP | 2006013080 A | 1/2006 | ............ | H01L 25/07 |
| JP | 2006121861 A | 5/2006 | ............ | H01L 25/07 |
| JP | 2006303006 A | 11/2006 | ............ | H01L 25/07 |
| JP | 2012114446 A | 6/2012 | ............ | G11C 5/01 |
| JP | 2013140862 A | 7/2013 | ............ | H01L 23/48 |
| JP | 2014086535 A | 5/2014 | ............ | H05K 1/02 |
| JP | 2014107378 A | 6/2014 | ............ | H01L 25/07 |
| JP | 2014204006 A | 10/2014 | ............ | H01L 21/60 |
| WO | 2016/177528 A1 | 11/1916 | ............ | H01L 23/34 |

OTHER PUBLICATIONS

Chinese Office Action, Application No. 201680026303.8, 5 pages, dated Jul. 22, 2019.

Indian Office Action, Application No. 201717034114, 6 pages, dated Oct. 16, 2019.

Japanese Office Action, Application No. 2017556695, 5 pages, dated Mar. 3, 2020.

* cited by examiner

POWER MODULE HAVING POWER DEVICE CONNECTED BETWEEN HEAT SINK AND DRIVE UNIT

CROSS-REFERENCE TO RELATED APPLICATIONS

This application is a U.S. National Stage Application of International Application No. PCT/EP2016/057567 filed Apr. 7, 2016, which designates the United States of America, and claims priority to DE Application No. 10 2015 208 348.9 filed May 6, 2015, the contents of which are hereby incorporated by reference in their entirety.

TECHNICAL FIELD

The present disclosure relates to power modules. The teachings thereof may be embodied in a power unit and/or a drive unit for driving the power unit, along with methods for producing a power module.

BACKGROUND

Power modules or power semiconductor modules may include power converters, e.g. inverters or rectifiers. Such power modules may include power semiconductor devices or power devices, e.g. transistors, IGBTs or diodes, which are usually disposed on a ceramic substrate and bonded thereto by soldering. The substrate populated with power devices is generally disposed in a housing. Bonds extending from a contact surface of the chip to a terminal area on the substrate are normally used to make electrical connections. Electrical devices which are electrically interconnected via bond wires suffer, on the one hand, because the bonds can easily break, particularly in the event of vibration and thermomechanical stress, and, on the other, such connections result in a very high inductance.

Another major challenge for power modules is the required dissipation of heat produced by the power devices during operation, particularly as the electrical devices are becoming ever smaller. Typically, either expensive thermal management is required or the performance of the power modules is limited because of the heat dissipation options.

SUMMARY

The teachings of the present disclosure may be used to implement a particularly reliable and compact power module wherein waste heat can be efficiently dissipated. For example, a power module (1) may include: a power unit (2) having a heat sink (4), at least one power device (7) disposed on the heat sink (4), and an insulating layer (12) covering the heat sink (4) and the at least one power device (7), wherein an underside (17) of the power unit (2) is constituted by an underside of the heat sink (4) and a top side (14) of the power unit (2) is constituted by at least one contact area (16) thermally and/or electrically coupled to the at least one power device (7) and a surface (15) of the insulating layer (12) surrounding the at least one contact area (16), and a drive unit (3) for driving the power unit (2), having at least one contact element (18) corresponding to the at least one contact area (16) of the power unit (2), which contact element, by the drive unit (3) being disposed on the top side (14) of the power unit (2), is disposed abutting the at least one contact area (16) of the power unit (2) for making electrical and/or thermal contact with the at least one power device (7).

In some embodiments, the at least one contact area (16) and the surface (15) of the insulating layer (12) are disposed flush and a level top side (14) of the power unit (2) is formed by the surface (15) of the insulating layer (12) and the at least one contact area (16).

In some embodiments, at least one electrical conductor track (10) is applied to the top side (8) of the heat sink (4), the at least one conductor track (10) is electrically connected to the at least one power device (7) via an electrical connecting element (13), and the electrical connecting element (13) is covered by the insulating layer (12).

In some embodiments, the at least one power device (7) inside the power unit (2) is mounted on the top side (8) of the heat sink (4) by means of so-called flip chip technology, whereby an electrical and/or thermal connection of the at least one power device (7) is disposed directly on a conductor track (10) mounted on the top side (8) of the heat sink (4) for making electrical contact.

In some embodiments, only one interconnection layer (9, 11) for bonding the at least one power device (7) to the top side (8) of the heat sink (4) is disposed between the at least one power device (7) and the top side (8) of the heat sink (4).

In some embodiments, the at least one power device (7) is disposed directly on the top side (8) of the heat sink (4) and is force-fit to the top side (8) of the heat sink (4) by applying pressure to the surface (15) of the insulating layer (12) and/or to the at least one contact area (16).

In some embodiments, the at least one contact element (18) of the drive unit (3) is implemented as a cooling element and/or as an electrical pressure contact element, wherein the force-fitting pressure is applied by the cooling element and/or by the pressure contact element when disposed on the at least one contact area (16) for establishing contact with the at least one power device (7).

In some embodiments, the heat sink (4) is implemented as a cooling plate (5) coated with an electrically insulating, thermally conductive material (6), wherein a surface of the electrically insulating, thermally conductive material (6) forms the top side (8) of the heat sink (4).

In some embodiments, the drive unit (3) comprises a circuit board (20) and at least one device (21, 23) for driving the at least one power device (7) of the power unit (2).

In some embodiments, the circuit board (20) has at least one sensor element (22) for detecting a physical characteristic of the power module (1).

In some embodiments, the circuit board (20) has at least two layers and the at least one device (21, 23) and/or the at least one sensor element (22) is disposed between the at least two layers.

In some embodiments, a first of the at least two layers is deposited directly onto the top side (14) of the power unit (2) and is bonded to the top side (14) of the power unit (2), the at least one device (21, 23) and/or the at least one sensor element (22) is disposed on the first layer, and a second of the at least two layers is deposited directly on the first layer, wherein the second layer covers the at least one device (21, 23) and/or the at least one sensor element (22).

In some embodiments, the drive unit (3) has the at least one contact element (18) on an underside of the drive unit (3) and, by the drive unit (3) being disposed on the top side (14) of the power unit (2), the at least one contact element (18) is implemented abutting the at least one contact area (16) for making electrical and/or thermal contact with the at least one power device (7).

In some embodiments, the drive unit (3) has at least one continuous gap corresponding to the contact area (16), said gap being disposed flush with the at least one contact area (16) when the drive unit (3) is disposed on the top side (14) of the power unit (2), wherein the at least one contact element (18) for making contact with the at least one power device (7) is disposed in the continuous gap.

Some embodiments may include a method for producing a power module (1) comprising a power unit (2) and a drive unit (3) for driving the power unit (2), wherein at least one power device (7) is disposed on a heat sink (4) of the power unit (2) and the heat sink (4) and the at least one power device (7) are covered by an insulating layer (12), wherein an underside (17) of the power unit (2) is constituted by an underside of the heat sink (4) and a top side (14) of the power unit (2) is constituted by at least one contact area (16) thermally and/or electrically coupled to the at least one power device (7) and by a surface (15) of the insulating layer (12) surrounding the at least one contact area (16), and, in the case of the drive unit (3), at least one contact element (18) corresponding to the at least one contact area (16) of the power unit (2) is disposed abutting the at least one contact area (16) of the power unit (2) for making electrical and/or thermal contact with the at least one power device (7) by the drive unit (3) being disposed on the top side (14) of the power unit (2).

BRIEF DESCRIPTION OF THE DRAWINGS

The embodiments presented with reference to the power module according to the teachings herein, and the advantages thereof, apply correspondingly to the methods described. The concepts will now be explained in greater detail with reference to an exemplary embodiment and the accompanying drawings in which.

In the figures, identical or functionally identical elements are provided with the same reference characters.

DETAILED DESCRIPTION

In some embodiments, a power module comprises a power unit and a drive unit for driving the power unit. The power unit has a heat sink, at least one power device disposed on the heat sink, and an insulating layer covering the heat sink and the at least one power device. An underside of the power unit is formed by an underside of the heat sink and a top side of the power unit is formed by at least one contact area thermally or electrically coupled to the at least one power device, and an insulating layer surface surrounding the at least one contact area. The drive unit has at least one contact element corresponding to the at least one contact area of the power unit and which, by the drive unit being disposed on the top side of the power unit, abuts the at least one contact area of the power unit for electrically and/or thermally contacting the at least one power device.

The power module can be designed as a power converter, for example. The at least one power device, which can be designed e.g. as a power MOSFET or IGBT, is disposed on the heat sink and is thermally coupled to the heat sink to dissipate the waste heat produced by the at least one power device during operation. In particular, the at least one power device is connected to the top side of the heat sink.

The area around the power device on the top side of the heat sink and the power device itself are covered by the insulating layer, in particular completely covered thereby. The insulating layer can be, for example, an encapsulating material, e.g. a so-called mold compound, and/or an insulating foil.

For electrical and/or thermal contacting of the at least one power device, a terminal on the at least one power device can be coupled to an electrical and/or thermal conducting element. Said electrical and/or thermal conducting element can pass through the insulating layer to the surface of the insulating layer so that only the contact areas of the conducting element are exposed on the top side of the power unit. The conducting element can contain copper, for example. In other words, the power device is embedded in the insulating layer, wherein, on the top side of the power unit, only the surface of the insulating layer and the at least one contact area, also termed a functional island or pad, is visible. The at least one power device is therefore completely encapsulated by the insulating layer and the heat sink. The at least one contact area is in particular at a defined position on the top side of the power unit, in particular directly over the power device embedded in the insulating layer.

The drive unit may have at least one contact element corresponding to the at least one contact area, in particular the defined position of the at least one contact area. Therefore, as soon as the drive unit is disposed in the intended manner on the top side of the power unit, the at least one contact element touches the contact area of the power unit, thereby establishing thermal and/or electrical contact with the at least one power device.

Therefore, the power unit and the drive unit may be of separate design and only combined at a later process stage, e.g. for preparing the complete power module, by placing the drive unit on the top side of the power unit. This means, for example, that the power unit can be easily standardized, while the drive unit can be adapted to suit the relevant application. The power module can therefore be produced particularly inexpensively.

In particular, by embedding the at least one power device in the insulating layer and disposing the drive unit on the top side of the power unit, the power module can be used without a housing. This means that power unit and the drive unit do not need to be incorporated in a separate, physical housing. The power module can therefore be made particularly compact and light-weight.

In some embodiments, the at least one contact area and the surface of the insulating layer are flush. Such an arrangement forms a level top side of the power unit with a flat plane of insulating layer surface and functional island/pad. A smooth or plane surface is to be understood as meaning an area that can be designated as such in terms of measurement tolerances and manufacturing tolerances. This level top side of the power unit may provide a power unit of particularly compact design.

In some embodiments, at least one electrical conductor track is mounted on the top side of the heat sink. The at least one conductor track is electrically connected to the at least one power device via an electrical connecting element. The electrical connecting element is covered by the insulating layer. Said electrical connecting element may include an electrically conductive area, e.g. a copper area, produced using a planar assembly and interconnection process. Such a planar assembly and interconnection process can be, for example, a Siemens-developed technology called SiPLIT (Siemens Planar Interconnect Technology).

Because the electrical connecting element is likewise covered or enclosed by the insulating layer, the electrical connecting element may be well protected from external influences, e.g. vibration and environmental effects. This may ensure a reliable electrical connection between the power device and the at least one conductor track. The electrical connecting element may include a shunt resistor so that current measurement is incorporated in the power module. A particularly reliable power module can therefore be produced and cooling of the power module can be optimized.

In some embodiments, at least one power device is mounted inside the power unit on the top side of the heat sink by means of so-called flip chip technology. Flip chip is an assembly and interconnection method for contacting the at least one power device by means of so-called bumps. The chip is mounted without additional lead wires or rather without the electrical connecting element, with its active contacting side or more specifically a terminal facing downward toward the heat sink. This may allow particularly small sizes/dimensions and short conductor lengths, which means that the power module has particularly low module inductance.

In some embodiments, only one interconnection layer for bonding the at least one power device to the top side of the heat sink is disposed between the at least one power device and the top side of the heat sink. Such an interconnection layer can be, for example, a solder or sinter layer. No physical component, in particular no circuit board or ceramic substrate, is disposed between the at least one power device and the top side of the heat sink. Heat produced during operation of the at least one power device can therefore be particularly well and efficiently dissipated to the heat sink.

In some embodiments, the at least one power device is disposed directly on the top side of the heat sink and force-fit to the top side of the heat sink by applying constant pressure to the surface of the insulating layer and/or to the at least one contact area. In such embodiments, the power device is therefore merely pressed onto the top side of the heat sink by applying constant pressure, thereby obviating the need for a solder or sinter layer. In other words, this means that solderless and sinterless device contacting is possible. This pressure contact technique prevents the power devices or chips from being detached from the top side of the heat sink particularly in the event of vibrations under operating conditions. This may be well-suited for high current applications. In the case of electrical contacting of the at least one power device using flip chip technology, the at least one power device is disposed directly on a contact area, e.g. the conductor track, on the top side of the heat sink where it is subject to constant pressure.

In some embodiments, at least one contact element of the drive unit includes a cooling element and/or an electrical pressure contact element. The pressure for the force-fit connection is applied by the cooling element and/or by the pressure contact element when disposed on the at least one contact area for contacting the at least one power device. Such a cooling element may include a cooling plunger possibly in conjunction with a so-called heat pipe, for dissipating the heat. Therefore, the at least one power device can be reliably attached and bilateral cooling of the at least one power device can be implemented, namely via the heat sink and the cooling plunger. In addition, the insulating layer can be elastic so that mechanical pressure can be applied particularly well to the at least one power device by means of the cooling element or more specifically a cooling structure. By this means, the reliability of the power module can also be increased by thermomechanical decoupling.

In some embodiments, the pressure contact element includes a pre-formed contact block in front of the drive unit or incorporated in the drive unit, e.g. a copper block, which exerts a constant pressure on the contact area by the drive unit being disposed on the power unit and therefore fixes the at least one power device particularly well. The pressure contact element can also be implemented as a spring contact element.

In some embodiments, the heat sink includes a cooling plate coated with an electrically insulating, thermally conductive material. A surface of the electrically insulating, thermally conductive material constitutes the top side of the heat sink. The cooling plate may include an aluminum plate coated with aluminum nitride or silicon nitride, for example, as the electrically insulating, thermally conductive material. Aluminum nitride and silicon nitride have a high thermal conductivity and are therefore well suited for cooling the power module. The electrically insulating, thermally conductive material may include a plate, a foil, or be sprayed onto the cooling plate. For example, the at least one conductor track and/or the interconnection layer of the at least one power device, e.g. the solder or the sinter paste, is then applied to said electrically insulating, thermally conductive material.

In some embodiments, the drive unit comprises a circuit board and at least one device for driving the at least one power device of the power unit. The at least one device may include a driver chip and/or a logic circuit and/or a control device. The at least one device of the drive unit can be connected to the contact element so that, when the drive unit is disposed on the power unit, the at least one device is electrically connected to the power device of the power unit, e.g. for driving the at least one power device.

In some embodiments, the circuit board has at least one sensor element for detecting a physical characteristic of the power module. The at least one sensor element may include a temperature sensor for measuring a temperature of the power module. The at least one sensor element may transmit the detected physical property, e.g. the detected temperatures, to a higher-level control unit, for example.

In some embodiments, the circuit board has a least two layers, and the at least one device and/or the at least one sensor element is disposed between the at least two layers. In other words, the circuit board may include a so-called multilayer circuit board, for example, wherein the at least one device and/or the at least one sensor element is disposed in a gap between the two layers and is thus completely enclosed by the two layers. This means that the at least one device and/or the at least one sensor element is embedded in the circuit board. For example, the driver terminals and the load terminals for the at least one power device of the power unit can be provided inside this circuit board and/or on the circuit board. In such embodiments, no additional expenditure is involved in manufacturing the load terminals and the unreliabilities to which the load terminal manufacturing process is prone can be avoided.

In some embodiments, a first of the at least two layers is deposited directly onto the top side of the power unit and is bonded to the top side of the power unit. The at least one device and/or the at least one sensor element is disposed on the first layer and a second of the at least two layers is deposited directly onto the first layer. The second layer covers the at least one device and/or the at least one sensor element. In other words, the at least one device and/or the at least one sensor element of the drive unit may be embedded between the two layers and the entire drive unit is bonded to the power unit by the bonding of the first layer to the top side of the power unit. The individual layers can be laminated on, e.g. as so-called prepreg layers. The direct application of the layers to the top side of the power unit and the concomitant bonding of the drive unit to the power unit, may provide a particularly compact, highly integrated and reliable power module.

In some embodiments, the circuit board has the at least one contact element on an underside of the drive unit and, by the drive unit being disposed on the top side of the power unit, the at least one contact element is implemented abutting the at least one contact area for electrical and/or thermal contacting of the at least one power device. The drive unit and/or the circuit board may include a pre-fabricated circuit board pressed onto the top side of the power unit e.g. via spring contacts or snap-on connections. The at least one contact element may include a copper block incorporated in the circuit board in some areas and/or disposed in a continuous manner in the drive unit over an entire thickness of the drive unit. Alternatively or in addition to the press fitting, the at least one contact element can be soldered to the at least one corresponding contact area, thereby bonding the drive unit to the power unit.

In some embodiments, the drive unit has at least one continuous gap corresponding to the contact area and which, when the drive unit is disposed on the top side of the power unit, is disposed flush with the at least one contact area, wherein the at least one contact element is disposed in the continuous gap for contacting the at least one power device. The drive unit and/or the circuit board may include a pre-fabricated circuit board containing the gaps, in particular across the thickness of the circuit board. When the pre-fabricated circuit board is disposed on the power unit, the at least one gap is disposed over the at least one contact area such that the contact area is accessible via the overlying gap.

In some embodiments, the circuit board is deposited in layers directly onto the surface of the insulating layer of the power unit, wherein during deposition the at least one contact area is not covered by the layers of the circuit board. In other words, the location above the at least one contact area or rather above the at least one power device can remain gapped. To provide thermal and/or electrical contacting, through-contacting can take place through the circuit board or rather through the gap of the circuit board, as the at least one contact element is disposed in the gap.

In some embodiments, the combination of power unit and drive unit forms a highly compact, highly integrated and intelligent power module, the underside of which is constituted by the underside of the heat sink and the top side of which is constituted by a top side of the drive unit. The power module can be implemented as a cube-shaped, highly compact block, for example, which has e.g. electrical and/or thermal contact elements for contacting the power unit only on the top side of the drive unit. The other surface regions of the power module are electrically insulated, thereby enabling the power module to be used without a housing, e.g. as a power converter.

Some embodiments may include a method for producing a power module comprising a power unit and a drive unit for driving the power unit. In the methods, a power device is disposed on a heat sink of the power unit and the heat sink and the at least one power device are covered with an insulating layer. Said underside of the power unit is constituted by an underside of the heat sink and a top side of the power unit is formed by at least one contact area thermally and/or electrically coupled to the at least one power device and an insulating layer surface surrounding the at least one contact area. By disposing the drive unit on the top side of the power unit, at least one contact element of the drive unit corresponding to the at least one contact area of the power unit is disposed abutting the at least one contact area of the power unit for electrical and/or thermal contacting of the at least one power device.

In the exemplary embodiment depicted in the figures, the described components of the embodiment each represent individual features to be considered independently of one another and which may function independently of one another in each case and must therefore also be viewed individually or in a combination other than that shown. Moreover, the embodiment described can also be supplemented by other of the already described features.

Figure 1A:
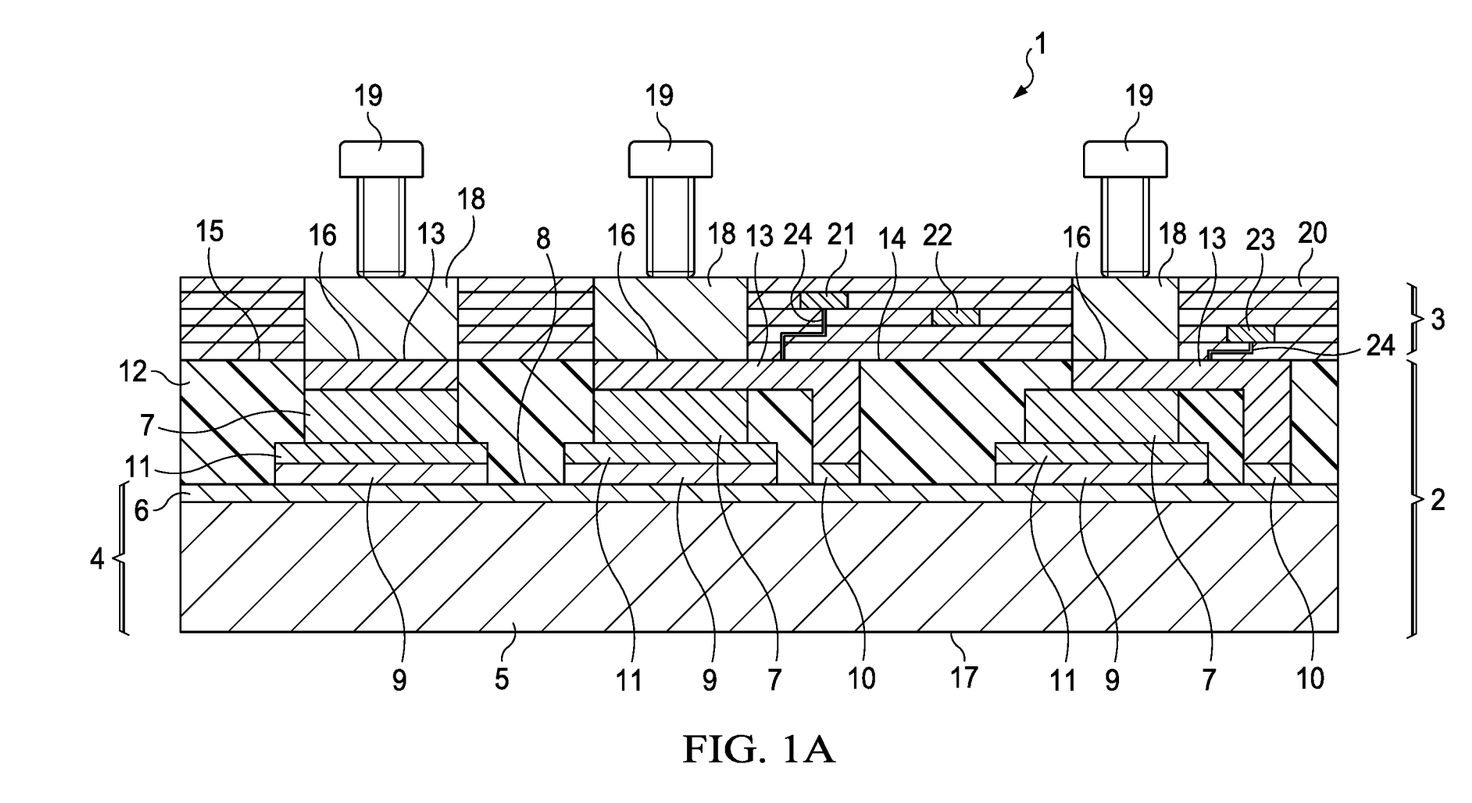
FIGS. 1A and 1B schematically illustrate two embodiments of a power module according to the teachings of the present disclosure.

FIG. 1 shows an example power module 1 having a power unit 2 and a drive unit 3 for driving the power unit 2. The power module 1 may include an AC/DC converter and/or a DC/DC converter. The power unit 2 shown comprises a heat sink 4 which has a cooling plate 5 and an electrically insulating, thermally conductive material 6 covering the cooling plate 5. In some embodiments, the electrically insulating, thermally conductive material 6 need only be provided if the cooling plate 5 is itself made of an electrically conductive material such as aluminum. The electrically insulating, thermally conductive material 6 may include silicon nitride, aluminum nitride, and/or a heat-conducting, electrically insulating organic material, and can be applied to the cooling plate 5 as a plate, foil, or by spraying-on. A surface of the electrically insulating, thermally conductive material 6 may constitute a top side 8 of the heat sink 4.

The heat sink 4 shown is used to cool a plurality of power devices 7 of the power unit 2, which devices may include IGBTs or power transistors disposed on the top side 8 of the heat sink 4 and are connected thereto. For bonding the power devices 7 to the top side 8 of the heat sink 4, patterned metal areas 9, 10 can be applied to the top side 8 of the heat sink 4. For bonding of the power devices 7, a bonding compound 11, e.g. solder or a sinter paste, can be applied to the metal areas 9, wherein the metal areas 9 and the bonding compound 11 form an interconnection layer which is disposed directly between the top side 8 of the heat sink 4 and the power devices 7. Only the interconnection layer 9, 11 is therefore provided between the top side 8 of the heat sink 4 and the power devices 7. No other physical component, in particular no circuit board or no ceramic substrate, is disposed between the power devices 7 and the top side 8 of the heat sink 4.

Figure 1B:
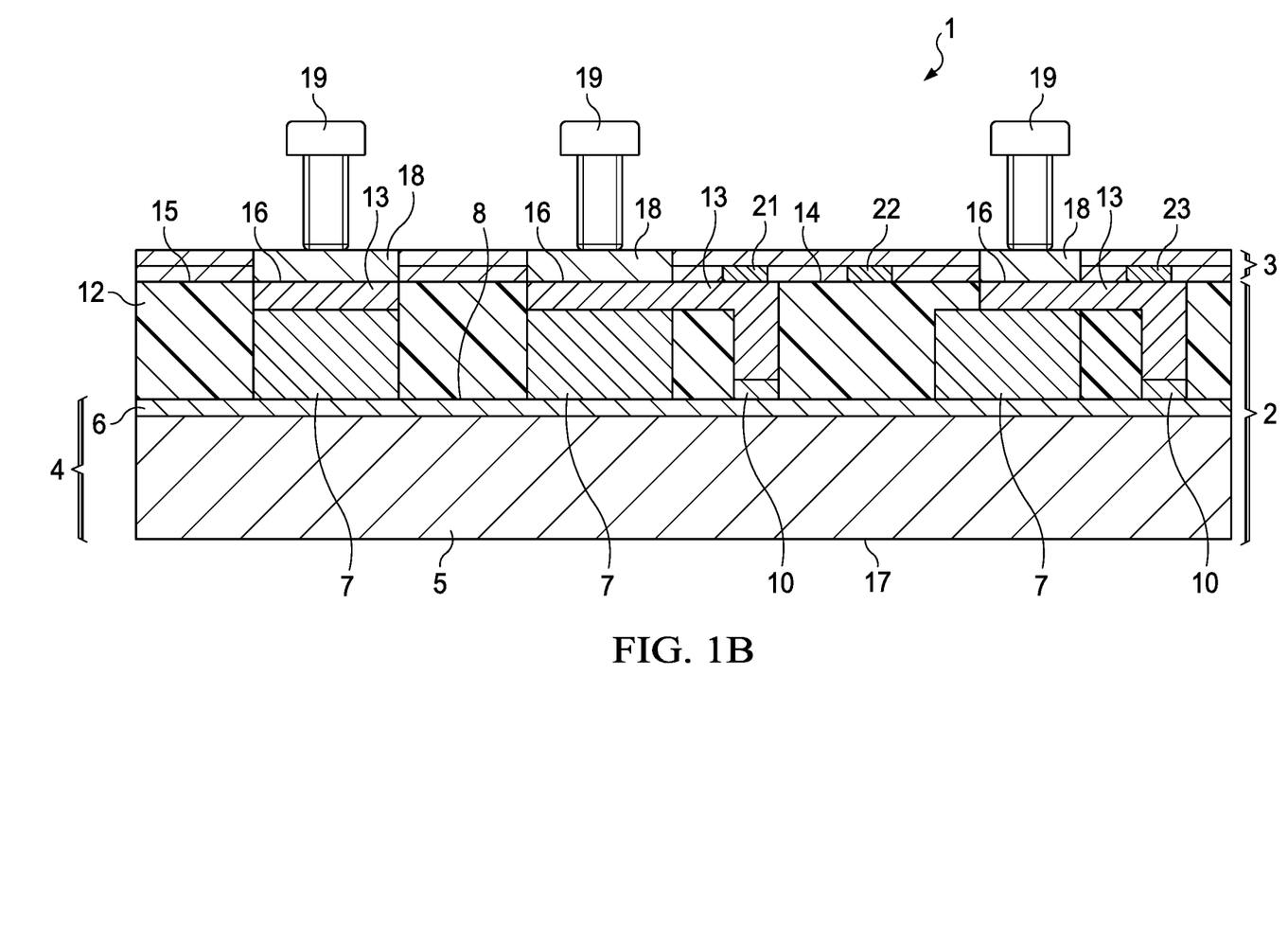

FIG. 1B shows another example power module 1 having a power unit 2 and a drive unit 3 for driving the power unit 2. In some embodiments, like that shown in FIG. 1B, the power devices 7 are disposed directly on the top side 8 of the heat sink 4, i.e. without providing the interconnection layer 9, 11, and are force-fit under constant pressure to the top side 8 of the heat sink 4. A solderless or sinterless power unit 2 can then be produced.

The metal areas 10 may include conductor tracks, for example, to which the power devices 7 are electrically connected for interconnecting the power devices 7. The power devices 7 can be electrically connected to the conductor tracks 10 e.g. via electrical connecting elements 13.

The power devices 7 and the top side 8 of the heat sink 4 shown are covered by an insulating layer 12. The insulating layer 12 can be deposited in a plurality of layers and comprise, for example, a so-called molding compound, an encapsulating material, and/or an insulating foil. Following application of a first sub-layer of the insulating layer 12, a metal layer, for example, can be applied to the sub-layer, said metal layer constituting the electrical connecting element 13 and therefore electrically connecting the power devices 7 to the conductor tracks 10. The electrical connecting element 13 above the power devices 7 and/or the metal area above the power devices 7, can be covered with a thin, thermally conductive but electrically insulating layer to enable the power devices 7 to be cooled on both sides.

In some embodiments, another sub-layer of the insulating layer 12 is applied which covers the electrical connecting elements 13 and the power devices 7. A top side 14 of the power unit 2 is formed by a surface 15 of the insulating layer 12 and contact areas 16 of the electrical connecting elements 13. For this purpose the materials of the insulating layer 12 and of the electrical connecting elements 13 can in particular be filled up to a uniform level, so that the top side 14 of the power unit 2 is implemented as a plane surface. An underside 17 of the power unit 2 is formed by an underside of the heat sink 4.

Figure 2:
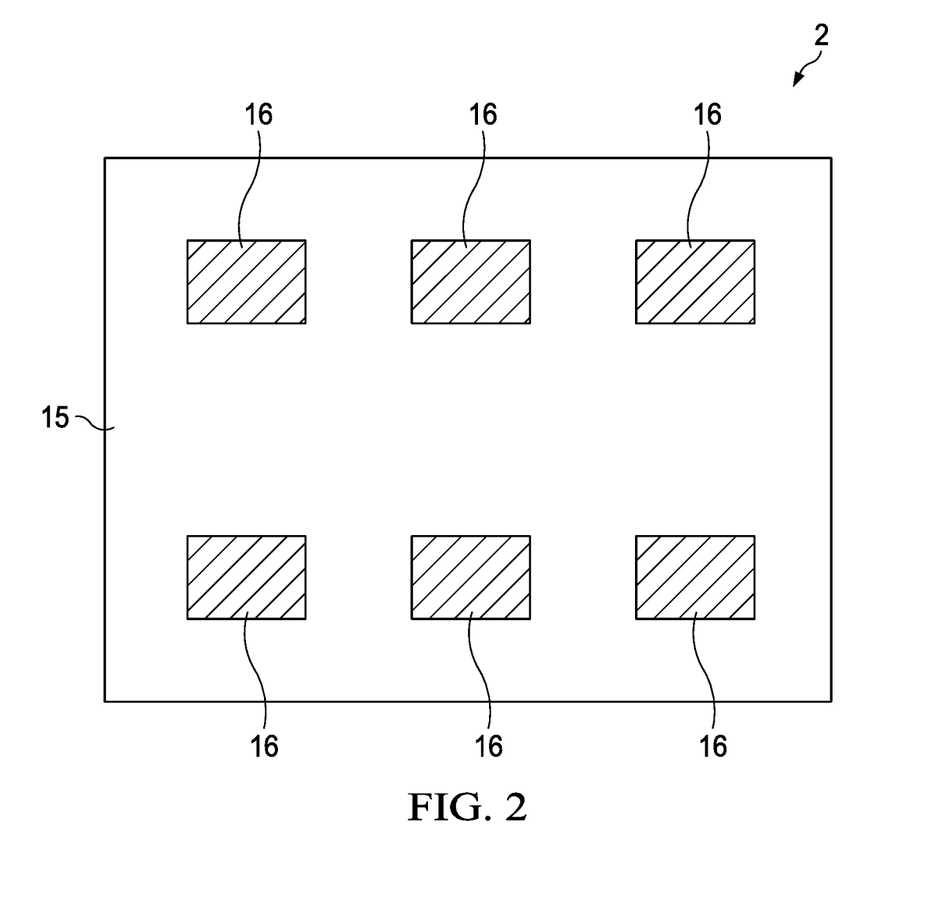
FIG. 2 schematically illustrates a power unit of an embodiment of a power module according to the teachings of the present disclosure in a plan view.

FIG. 2 shows a plan view onto the top side 14 of the power unit 2. The top side 14 of the power unit 2 is formed as a plane, smooth surface comprising the contact areas 16 and the surface 15 of the insulating layer 12. The drive unit 3 is disposed on the top side 14 of the power unit 2, which constitutes an electrical connection for the power unit 2. The drive unit 3 has contact elements 18 corresponding to the contact areas 16 for the electrical and/or thermal contacting of the power devices 7, which elements can be implemented e.g. as copper blocks and/or pressure contact elements and/or spring contacts and/or cooling plungers. The contact elements 18 are disposed abutting the contact areas 16 where they may be soldered or pressed onto the contact areas 16 by means of spring clips or screwed connections 19.

In some embodiments, the drive unit 3 includes a multi-layer circuit board 20, for example. The circuit board 20 can be a separate component which may be pressed to the top side 14 of the power unit 2 via the screwed connections 19 or the spring clips. However, in some embodiments, the circuit board 20 is deposited directly onto the top side 14 of the power unit 2 in a plurality of layers and is thus bonded to the top side 14 of the power unit 2. The individual layers of the circuit board can be so-called prepreg layers, for example.

Devices 21, 22, 23 can be incorporated and/or embedded in the circuit board 20. The device 21 may include a driver chip, for example, electrically connected to the electrical connecting element 13 of the power unit 2 and therefore to the power device 7 via another electrical connecting element 24. The device 22 may include a sensor element, e.g. a temperature sensor for measuring a temperature of the power module 1. A temperature sensor may wirelessly transmit the measured values determined, e.g. here the temperature, to a higher-level control unit. The device 23 may include a logic chip connected to the electrical connecting element 13 of the power unit 2 via an electrical connecting element 24.

Because the power devices 7 are embedded in the insulating layer 12 inside the power unit 2 and therefore fully encapsulated and, in addition, the drive unit 3 is disposed with its contact elements 18 in a precision-fit manner on the top side 14 of the power unit 2, a particularly compact, highly integrated and intelligent power module 1 is formed which can be used operationally and in the intended manner without a housing, e.g. as a power converter.

What is claimed is:

1. A method for producing a power module comprising a power unit and a drive unit for driving the power unit, the method comprising:

disposing a power device directly on a top side of a heat sink of the power unit;

covering the heat sink and the power device with an insulating layer, including applying pressure to the insulating layer providing a force-fit between the power device and the top side of the heat sink;

wherein an underside of the power unit is defined by an underside of the heat sink and a top side of the power unit is defined by a contact area thermally and/or electrically coupled to the power device and by a surface of the insulating layer surrounding the contact area; and a contact element of the drive unit for driving the power unit corresponding to the contact area of the power unit is disposed abutting the contact area for making electrical and/or thermal contact with the power device by the drive unit for driving the power unit being disposed on the top side of the power unit;

wherein the contact element of the drive unit for driving the power unit comprises a cooling element;

wherein the circuit board comprises two layers and a sensor element for detecting a physical characteristic of the power module, wherein the sensor element for detecting a physical characteristic of the power module is disposed between the two layers;

wherein a first of the two layers is deposited directly onto the top side of the power unit and is bonded to the top side of the power unit;

wherein the sensor element is disposed on the first of the two layers, a second of the two layers is deposited directly on the first of the two layers, and the second of the two layers covers the sensor element for detecting a physical characteristic of the power module;

wherein the contact element of the drive unit for driving the power unit comprises an electrical pressure contact element and a force-fitting pressure is applied by the electrical pressure contact element when disposed on the contact area for establishing contact with the power device; and wherein the contact element of the drive unit for driving the power unit comprises a cooling element disposed abutting the contact area of the power unit for making electrical and/or thermal contact with the power device.

2. A power module comprising:

a power unit including a heat sink;

a power device disposed directly on a top side of the heat sink;

an insulating layer covering the heat sink and the power device;

wherein an underside of the power unit is defined by an underside of the heat sink;

a top side of the power unit is defined by a contact area thermally and/or electrically coupled to the power device and a surface of the insulating layer surrounding the contact area; and the power device force-fit to the top side of the heat sink by applying pressure to the surface of the insulating layer and/or to the at least one contact area; and a drive unit for driving the power unit, the drive unit for driving the power unit comprising a circuit board, a device for driving the power device of the power unit, and a contact element corresponding to the contact area of the power unit;

wherein the circuit board comprises two layers and a sensor element for detecting a physical characteristic of the power module, wherein at least one of the device for driving the power device of the power unit and the sensor element for detecting a physical characteristic of the power module is disposed between the two layers;

wherein a first of the two layers is deposited directly onto the top side of the power unit and is bonded to the top side of the power unit;

wherein the device for driving the power device of the power unit or the sensor element for detecting a physical characteristic of the power module is disposed on the first of the two layers, a second of the two layers is deposited directly on the first of the two layers, and the second of the two layers covers at least one of the device for driving the power device of the power unit and the sensor element for detecting a physical characteristic of the power module;

wherein the contact element of the drive unit comprises an electrical pressure contact element and a force-fitting pressure is applied by the electrical pressure contact element when disposed on the contact area for establishing contact with the power device; and wherein the contact element of the drive unit comprises a cooling element disposed abutting the contact area of the power unit for making electrical and/or thermal contact with the power device.

3. The power module as claimed in claim 2, wherein the contact area and the surface of the insulating layer are disposed flush, forming a level top side of the power unit.

4. The power module as claimed in claim 2, further comprising an electrical conductor track along the top side of the heat sink;

wherein the electrical conductor track is electrically connected to the power device via an electrical connecting element; and the insulating layer covers the electrical connecting element.

5. The power module as claimed in claim 2, wherein the power device is mounted on the top side of the heat sink by means of flip chip technology, whereby an electrical and/or thermal connection of the power device is disposed directly on a conductor track mounted on the top side of the heat sink for making electrical contact.

6. The power module as claimed in claim 2, wherein the heat sink comprises a cooling plate coated with an electrically insulating and thermally conductive material; and a surface of the electrically insulating, thermally conductive material forms the top side of the heat sink.

7. The power module as claimed in claim 2, wherein the contact element is disposed on an underside of the drive unit for driving the power unit; and the contact element abuts the contact area for making electrical and/or thermal contact with the power device.

8. The power module as claimed in claim 2, wherein the drive unit for driving the power unit comprises a continuous gap corresponding to the contact area;

the continuous gap disposed flush with the contact area when the drive unit for driving the power unit is disposed on the top side of the power unit; and the contact element for making contact with the power device is disposed in the continuous gap.

* * * * *